(12) United States Patent
Wang et al.

(10) Patent No.: US 11,867,955 B2
(45) Date of Patent: Jan. 9, 2024

(54) SYSTEM FOR MONITORING LASER LUMINOUS POWER AND METHOD, AND COLLIMATING LENS THEREOF

(71) Applicant: HANGZHOU MO-LINK TECHNOLOGY CO. LTD, Hangzhou (CN)

(72) Inventors: Hao Wang, Hangzhou (CN); Hai Tang Qin, Hangzhou (CN)

(73) Assignee: HANGZHOU MO-LINK TECHNOLOGY CO. LTD, Hangzhou (CN)

( * ) Notice: Subject to any disclaimer, the term of this patent is extended or adjusted under 35 U.S.C. 154(b) by 113 days.

(21) Appl. No.: 17/391,176

(22) Filed: Aug. 2, 2021

(65) Prior Publication Data

US 2022/0317390 A1      Oct. 6, 2022

(30) Foreign Application Priority Data

Mar. 31, 2021   (CN) .......................... 202110349856.X

(51) Int. Cl.
*G02B 6/42* (2006.01)
(52) U.S. Cl.
CPC ......... *G02B 6/4214* (2013.01); *G02B 6/4206* (2013.01); *G02B 6/4296* (2013.01)
(58) Field of Classification Search
CPC ....................................................... G02B 6/42
USPC .......................................................... 385/33
See application file for complete search history.

(56) References Cited

U.S. PATENT DOCUMENTS

| 4,117,319 | A | * | 9/1978 | White, III | G02B 3/08 356/152.2 |
| 4,716,851 | A | * | 1/1988 | Saito | B05D 1/206 425/808 |
| 4,961,625 | A | * | 10/1990 | Wood | G02B 27/01 359/708 |
| 5,231,379 | A | * | 7/1993 | Wood | G02B 27/01 359/708 |
| 5,873,726 | A | * | 2/1999 | Gillbe | G09B 9/326 434/38 |
| 9,703,086 | B1 | * | 7/2017 | Chen | G02B 6/4214 |
| 10,681,328 | B1 | * | 6/2020 | Shpunt | G02B 30/35 |
| 2001/0006434 | A1 | * | 7/2001 | Yoo | G11B 7/1362 |
| 2001/0048063 | A1 | * | 12/2001 | Yanagawa | G11B 7/1376 |
| 2003/0147328 | A1 | * | 8/2003 | Horimai | G11B 7/0065 |
| 2004/0062157 | A1 | * | 4/2004 | Kawabe | G11B 7/08511 |

(Continued)

*Primary Examiner* — Kaveh C Kianni
(74) *Attorney, Agent, or Firm* — Li & Cai Intellectual Property (USA) Office

(57) ABSTRACT

A system for monitoring laser luminous power and method, and a collimating lens thereof are provided, which relate to the field of optical communications. The collimating lens includes a lens main body, where the lens main body includes a light-incident surface into which a divergent beam is input; a first light exit surface from which a collimated beam is output; a second light exit surface; and a reflective surface which reflects a certain proportion of the light beam to the second light exit surface for output. The system includes a laser, the collimating lens described above, and a photoelectric conversion chip. The laser is connected to the light-incident surface of the collimating lens via an optical path, and the photoelectric conversion chip is connected to the second light exit surface of the collimating lens via an optical path.

15 Claims, 6 Drawing Sheets

(56) References Cited

U.S. PATENT DOCUMENTS

| | | | |
|---|---|---|---|
| 2004/0175072 A1* | 9/2004 | Lam | G02B 6/3572 |
| | | | 385/39 |
| 2007/0057163 A1* | 3/2007 | Ishigami | G02B 6/4246 |
| | | | 250/216 |
| 2008/0106794 A1* | 5/2008 | Messina | G02B 27/144 |
| | | | 359/629 |
| 2008/0131111 A1* | 6/2008 | Messina | G02B 19/0066 |
| | | | 348/E5.029 |
| 2008/0279060 A1* | 11/2008 | Nishi | G11B 7/1374 |
| | | | 359/821 |
| 2009/0086330 A1* | 4/2009 | Matsuzaki | G11B 7/13925 |
| | | | 359/648 |
| 2010/0265974 A1* | 10/2010 | Wang | H01S 5/4025 |
| | | | 372/38.01 |

* cited by examiner

SYSTEM FOR MONITORING LASER LUMINOUS POWER AND METHOD, AND COLLIMATING LENS THEREOF

FIELD OF THE DISCLOSURE

The present disclosure relates to the field of optical communications technologies, and in particular, to a system for monitoring laser luminous power and method, and a collimating lens used in the monitoring system or monitoring method.

BACKGROUND OF THE DISCLOSURE

In an optical communication system, light emitted from a laser is coupled into an optical fiber after passing through an optical system, to realize optical signal transmission. A system for transmission from the laser to the optical fiber may be subjected to design optimization, packaging and fixing so that the fiber output optical power meets application requirements. However, the stability of the laser's own luminous power is affected by factors such as the drive current, temperature, time, and its own lifetime. In order to prevent the impact of fluctuation in the laser luminous power on the optical fiber communication system, it is required to monitor the optical power of the laser in real time and further use a closed-loop control system, so as to achieve stable output of the optical power.

The existing monitoring method roughly has two types. In one type, for lasers with a backlight design, for example, edge-emitting FP/DFP semiconductor lasers, the backlight can be directly used to realize monitoring of the output optical power. In the other type, for lasers without a backlight design, for example, vertical-cavity surface-emitting lasers (VCSELs), in addition to the necessary collimating/coupling lens, a beam splitter, a beam-splitting prism, etc. further need to be used to acquire part of the optical power emitted from the laser for monitoring of the optical power. However, such a method requires an additional optical element, increasing the size and cost of a light-emitting unit.

SUMMARY OF THE DISCLOSURE

The present disclosure aims to provide a system for monitoring laser luminous power and method, and a collimating lens thereof, so as to solve, at least to a certain extent, the foregoing defects in monitoring the luminous power of a laser without a backlight design.

To achieve the foregoing objective, the present disclosure adopts the following technical solutions:

A collimating lens is provided, which is used to receive a divergent beam and convert it to a collimated beam. The collimating lens includes a lens main body and the lens main body includes: a light-incident surface into which the divergent beam is input; a first light exit surface from which the collimated beam is output; a second light exit surface; and a reflective surface which reflects a certain proportion of a light beam to the second light exit surface for output.

In the foregoing collimating lens, preferably, the lens main body includes a cylindrical section and a truncated cone section; a free end of the cylindrical section forms the light-incident surface and a free end of the truncated cone section forms the first light exit surface; a protruding portion is formed along an optical axis direction at the free end of the truncated cone section, and the reflective surface is formed by plating the protruding portion with a reflective film; and a part of the other end of the truncated cone section that protrudes from a side of the cylindrical section forms the second light exit surface.

In the foregoing collimating lens, preferably, an angle θ between the plane in which the second light exit surface is located and an optical axis of the first light exit surface is set in such a manner that the angle θ makes an incident angle of the light beam on the second light exit surface after being reflected by the reflective surface less than an angle of total reflection; and a height of the second light exit surface is set in such a manner that the light beam reflected by the reflective surface is completely incident on the second light exit surface.

In the foregoing collimating lens, preferably, a projection of the reflective surface on the free end of the truncated cone section is in a sector shape, and an area $S_{13}$ of the sector shape is set in such a manner that:

$$S_{13}/(S_{12}+S_{13})=W_1/W_2$$

where $S_{13}$ is the area of the sector shape, $S_{12}$ is an area of the first light exit surface, $W_1$ is a required power of a feedback beam, and $W_2$ is a total power of the light beam input to the light-incident surface.

In the foregoing collimating lens, preferably, the light-incident surface is a convex spherical surface and the first light exit surface is a plane.

In the foregoing collimating lens, preferably, the light-incident surface is a plane and the first light exit surface is a convex spherical surface.

A system for monitoring laser luminous power is provided, which includes: a laser; the collimating lens described in any one of the foregoing items; and a photoelectric conversion chip, where the laser is connected to the light-incident surface of the collimating lens via an optical path, and the photoelectric conversion chip is connected to the second light exit surface of the collimating lens via an optical path.

A method for monitoring laser luminous power is provided, which includes the following steps: emitting a light beam by a laser to a light-incident surface of a collimating lens; emerging a collimated beam from a first light exit surface of the collimating lens and transmitting the collimated beam to an optical fiber; emerging a feedback beam from a second light exit surface of the collimating lens to a photoelectric conversion chip; and generating luminous power of the laser according to an electrical signal converted by the photoelectric conversion chip, where the collimating lens is the collimating lens described in any one according to the foregoing items.

Compared to the prior art, the present disclosure at least has the following beneficial effects:

For a laser without a backlight design, the present disclosure realizes splitting of luminous power without the need to use an additional optical element, thus achieving low cost and miniaturization of a light-emitting unit. Moreover, the present disclosure can control the proportion of monitored power.

Figure 1:
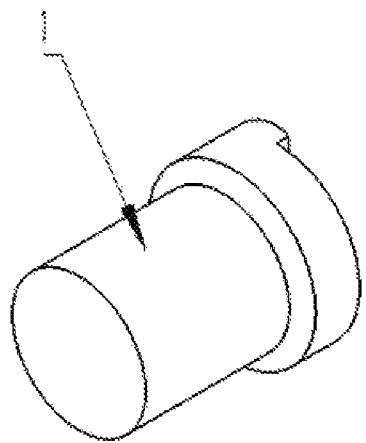
FIG. 1 is a three-dimensional diagram of an embodiment of a collimating lens.

| Reference numerals: | |
|---|---|
| Lens main body | 1 |
| Light-incident surface | 11 |
| First light exit surface | 12 |
| Reflective surface | 13 |
| Second light exit surface | 14 |
| Laser | 2 |
| Photoelectric conversion chip | 3 |
| Coupling lens | 4 |
| Optical fiber | 5 |
| Feedback light energy | 61 |
| Transmitted light energy | 62 |

DETAILED DESCRIPTION OF THE EXEMPLARY EMBODIMENTS

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

The present disclosure is further described below with reference to the accompanying drawings and embodiments.

Figure 2:
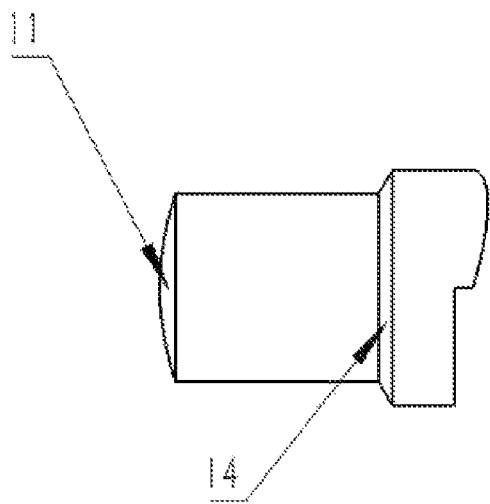
FIG. 2 is a schematic diagram of a light-incident surface and a second light exit surface of the collimating lens.
Figure 3:
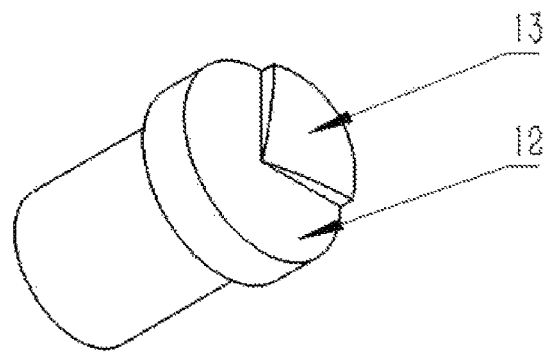
FIG. 3 is a schematic diagram of a first light exit surface and a reflective surface of the collimating lens.

FIGS. 1 to 3 show an embodiment of a collimating lens which integrates two functions: collimation of light emitted from a laser and capturing a certain proportion of optical power for optical power control.

With reference to FIGS. 1 to 3, the collimating lens includes a lens main body 1, where the lens main body 1 includes a light-incident surface 11 into which a divergent beam is input; a first light exit surface 12 from which a collimated beam is output; a second light exit surface 14; and a reflective surface 13 which reflects a certain proportion of the light beam to the second light exit surface 14 for output.

The lens main body 1 includes a cylindrical section and a truncated cone section. A free end of the cylindrical section forms the light-incident surface 11 which is specifically designed into a convex spherical surface. A free end of the truncated cone section forms the first light exit surface 12 which is specifically designed into a plane. A protruding portion is formed along an optical axis direction at the free end of the truncated cone section, and the reflective surface 13 is formed by plating the protruding portion with a high-reflective film. The reflective surface 13 may be specifically designed into a parabolic or ellipsoidal surface. A part of the other end of the truncated cone section that protrudes from the side of the cylindrical section forms the second light exit surface 14.

Figure 4:
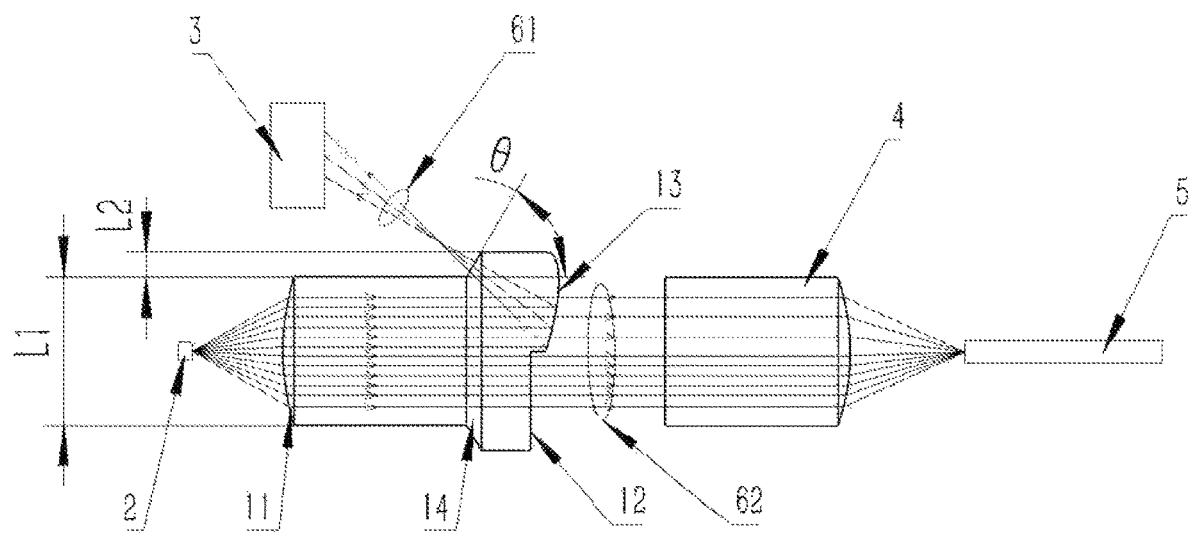
FIG. 4 is an optical path principle diagram of an embodiment of a system for monitoring laser luminous power.

FIG. 4 shows an optical path of an embodiment of a system for monitoring laser luminous power.

Referring to FIG. 4, the system for monitoring laser luminous power includes a laser 2, the collimating lens described above, and a photoelectric conversion chip 3. The laser 2 is connected to the light-incident surface 11 of the collimating lens via an optical path, and the photoelectric conversion chip 3 is connected to the second light exit surface 14 of the collimating lens via an optical path.

A method for monitoring laser luminous power is as follows: The laser 2 emits a light beam with a certain divergence angle, and after passing through the light-incident surface 11 of the collimating lens, the light beam turns into a collimated beam. A large part of the collimated beam does not change in the transmission direction after reaching the first light exit surface 12 and emerges from the first light exit surface 12; and then enters a subsequent optical fiber coupling system, namely, a coupling lens 4 in FIG. 4. The coupling system focuses the collimated beam and then couples the beam into an optical fiber 5 for optical signal transmission. This part of light is also referred to as transmitted light energy 62. A small part of the collimated beam is incident on the reflective surface 13 after reaching the first light exit surface 12 and is totally reflected by the reflective surface 13; then emerges from the second light exit surface 14; and finally is incident on the photoelectric conversion chip 3. This part of light beam is referred to as a feedback beam or feedback light energy 61 in the present application. Because the proportion of the feedback beam to the total beam is fixed, the luminous power of the laser 2 can be monitored according to the power of the feedback beam.

The diameter of the first light exit surface 12 may be determined according to the divergence angle and the focal length of the laser 2 and a thickness between the light-incident surface 11 and the first light exit surface 12 of the collimating lens. The diameter should be slightly greater than the size of the collimated beam, that is, the diameter is L1+2*L2. The second light exit surface 14 has an axisymmetric design and is distributed on the periphery of the first light exit surface 12, and is unlikely to interfere with the incidence of the divergent beam to the first light exit surface 12 and the reflective surface 13. An angle formed between the second light exit surface 14 and an optical axis direction is θ, and the angle θ is set in such a manner that the angle θ makes an incident angle of the light beam on the second light exit surface 14 after being reflected by the reflective surface 13 less than an angle of total reflection, thus avoiding total reflection of the light beam inside the lens, so that the light beam emerges from the second light exit surface 14. The height (namely, L2) of the second light exit surface 14 is set in such a manner that the light beam reflected by the reflective surface 13 can be completely incident on the second light exit surface 14.

Figure 5:
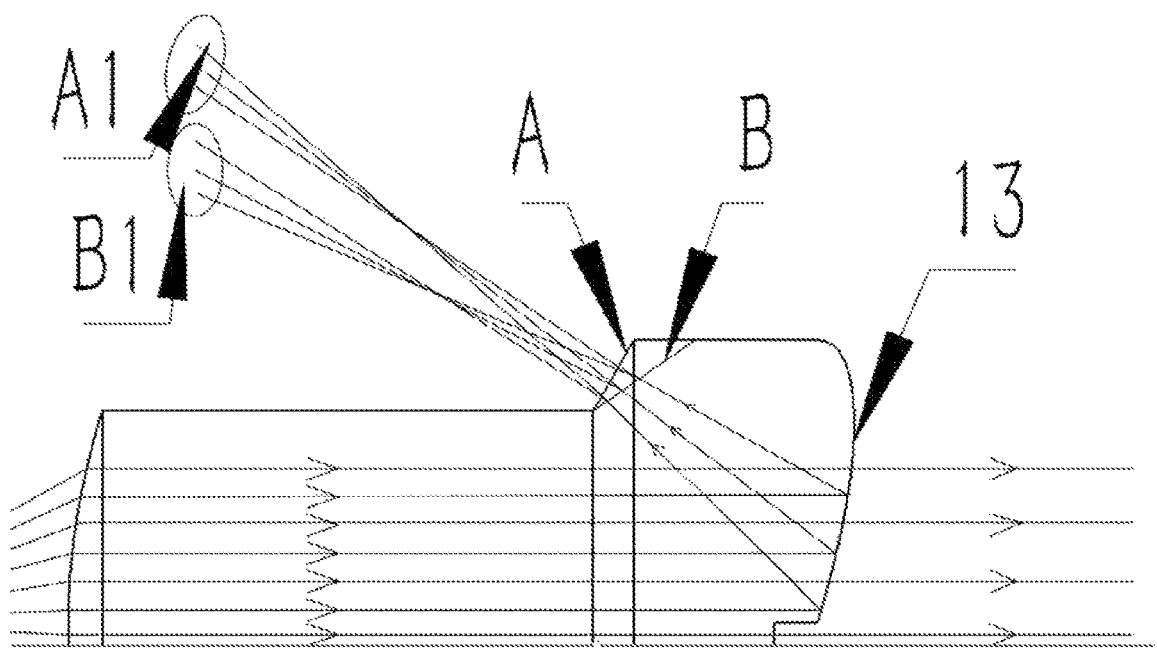
FIG. 5 is a schematic diagram of adjusting a light beam direction via an angle θ.

By changing the angle θ, a direction of the light beam emerging from the second light exit surface 14 can be adjusted. As shown in FIGS. 5, A and B denote positions at different angles of θ. When the light beam reflected by the reflective surface 13 is incident on the position A, an incident angle of the light beam on the second light exit surface 14 is AOIA; and when the light beam is incident on the position B, an incident angle of the light beam on the second light exit surface 14 is AOIB. Because AOIA<AOIB, the directions, which are respectively A1 and B1, from the two positions are different after the light beam emerges from the second light exit surface 14. Therefore, the actual placement requirement for the photoelectric conversion chip 3 can be met by adjusting the angle of θ.

Figure 6:
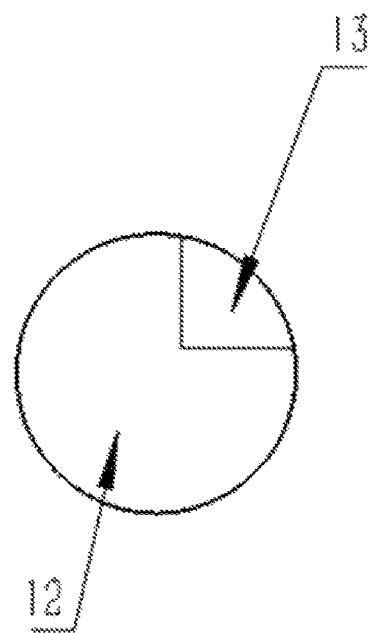
FIGS. 6 to 8 are schematic diagrams of adjusting a ratio of the power of feedback light to the total luminous power of a laser.
Figure 7:
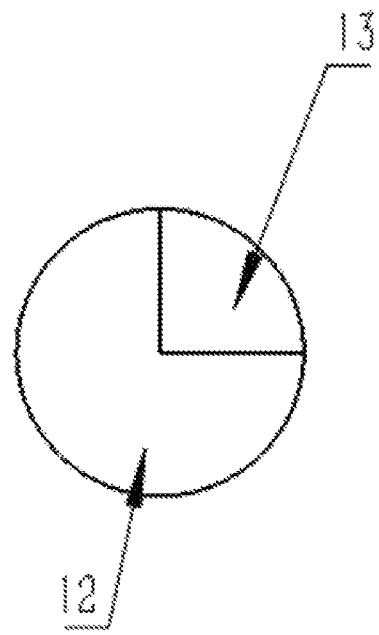
Figure 8:
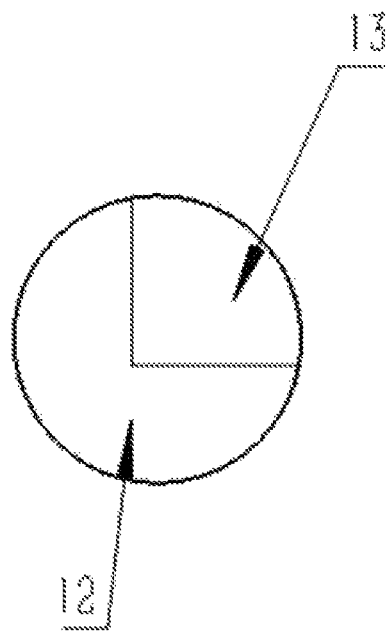

In the present application, a projection of the reflective surface 13 on the first light exit surface 12 is a sector shape, and an area S13 of the sector shape is set in such a manner that S13/(S12+S13)=W1/W2, where S13 is the area of the sector shape, S12 is an area of the first light exit surface 12, W1 is a required power of the feedback beam, and W2 is a total power of the light beam input to the light-incident surface 11. It can be seen that, by changing the area of the reflective surface 13, the ratio of the power of the feedback beam to the total luminous power of the laser 2 can be adjusted. FIG. 6 to FIG. 8 show three reflective surfaces 13 with different proportions, where the proportion in FIG. 6 is less than 25%, the proportion in FIG. 7 is equal to 25%, and the proportion in FIG. 8 is greater than 25%. A specific proportion may be designed according to requirements in an actual application scenario.

Figure 9:
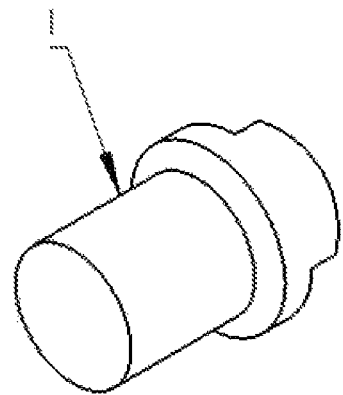
FIG. 9 is a three-dimensional diagram of another embodiment of a collimating lens.
Figure 10:
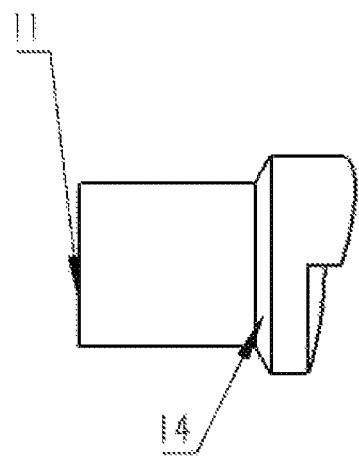
FIG. 10 is a schematic diagram of a light-incident surface and a second light exit surface of the collimating lens in the another embodiment.
Figure 11:
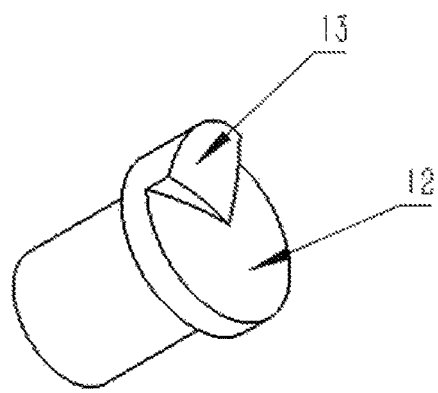
FIG. 11 is a schematic diagram of a first light exit surface and a reflective surface of the collimating lens in the another embodiment.

FIGS. 9 to 11 show another embodiment of the collimating lens. In the another embodiment, the collimating lens integrates two functions: collimation of light emitted from a laser and capturing a certain proportion of optical power for optical power control.

With reference to FIGS. 9 to 11, the collimating lens includes a lens main body 1, where the lens main body 1 includes a light-incident surface 11 into which a divergent beam is input; a first light exit surface 12 from which a collimated beam is output; a second light exit surface 14; and a reflective surface 13 which reflects a certain proportion of the light beam to the second light exit surface 14 for output.

The lens main body 1 includes a cylindrical section and a truncated cone section. A free end of the cylindrical section forms the light-incident surface 11 which is specifically designed into a plane. A free end of the truncated cone section forms the first light exit surface 12 which is specifically designed into a convex spherical surface. A protruding portion is formed along an optical axis direction at the free end of the truncated cone section, and the reflective surface 13 is formed by plating the protruding portion with a high-reflective film. The reflective surface 13 may be specifically designed into a parabolic or ellipsoidal surface. A part of the other end of the truncated cone section that protrudes from the side of the cylindrical section forms the second light exit surface 14.

Figure 12:
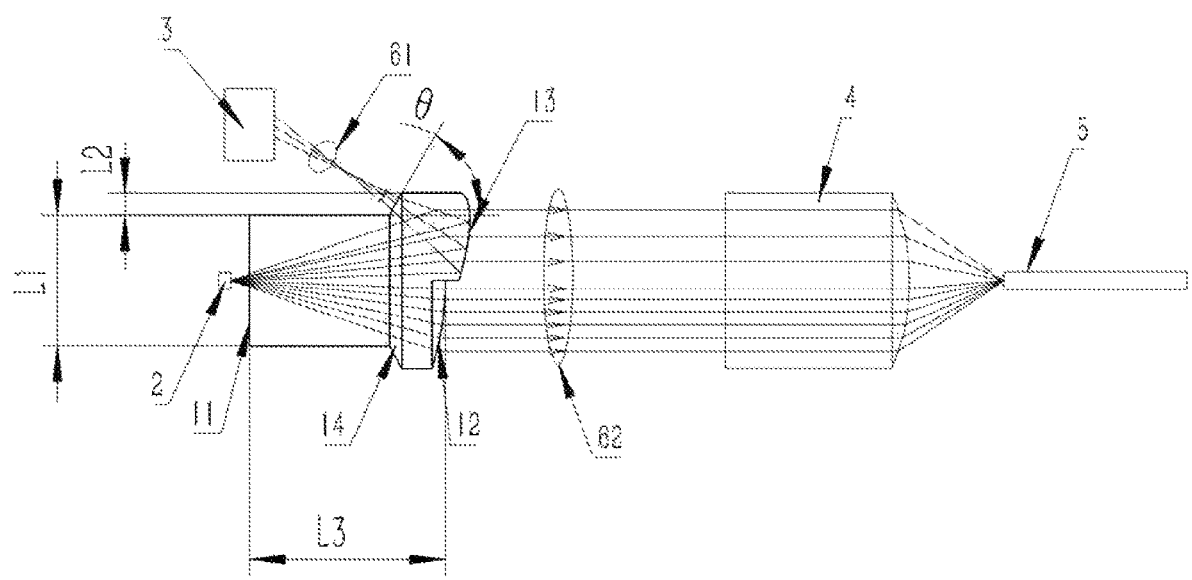
FIG. 12 is an optical path principle diagram of another embodiment of a system for monitoring laser luminous power.

FIG. 12 shows an optical path of another embodiment of a system for monitoring laser luminous power.

Referring to FIG. 12, the system for monitoring laser luminous power includes a laser 2, the collimating lens in the another embodiment, and a photoelectric conversion chip 3. The laser 2 is connected to the light-incident surface 11 of the collimating lens via an optical path, and the photoelectric conversion chip 3 is connected to the second light exit surface 14 of the collimating lens via an optical path.

A method for monitoring laser luminous power is as follows: The laser 2 emits a light beam with a certain divergence angle, and after passing through the light-incident surface 11 of the collimating lens, a large part of the light beam is incident on the first light exit surface 12 and collimated by the first light exit surface 12; and then emerges from the first light exit surface to the subsequent optical fiber coupling system, namely, a coupling lens 4 in FIG. 12. The coupling system focuses the collimated beam and then couples the beam into an optical fiber 5 for optical signal transmission. This part of light is also referred to as transmitted light energy 62. After passing through the light-incident surface 11 of the collimating lens, a small part of the light beam is incident on the reflective surface 13 and totally reflected by the reflective surface 13; then emerges from the second light exit surface 14; and finally is incident on the photoelectric conversion chip 3. This part of light beam is referred to as a feedback beam or feedback light energy 61 in the present application. Because the proportion of the feedback beam to the total beam is fixed, the luminous power of the laser 2 can be monitored according to the power of the feedback beam.

The diameter of the first light exit surface 12 may be determined according to the divergence angle and the focal length of the laser 2 and a thickness L3 between the light-incident surface 11 and the first light exit surface 12 of the collimating lens. The diameter should be slightly greater than the size of the collimated beam, that is, the diameter is L1+2*L2. The second light exit surface 14 has an axisymmetric design and is distributed on the periphery of the first light exit surface 12, and is unlikely to interfere with the incidence of the divergent beam to the first light exit surface 12 and the reflective surface 13. An angle formed between the second light exit surface 14 and an optical axis direction is θ, and the angle θ is set in such a manner that the angle θ makes an incident angle of the light beam on the second light exit surface 14 after being reflected by the reflective surface 13 less than an angle of total reflection, thus avoiding total reflection of the light beam inside the lens, so that the light beam emerges from the second light exit surface 14. The height (namely, L2) of the second light exit surface 14 is set in such a manner that the light beam reflected by the reflective surface 13 can be completely incident on the second light exit surface 14.

Likewise, by changing the angle θ, a direction of the light beam emerging from the second light exit surface 14 can be adjusted; and by changing the area of the reflective surface 13, the ratio of the power of the feedback beam to the total luminous power of the laser 2 can be adjusted.

It can be seen from the foregoing embodiments that the present disclosure enables the collimating lens to have a light splitting function by a design to the collimating lens. In this way, in monitoring of luminous power of a laser without a backlight design, the present disclosure realizes splitting of luminous power without the need to use an additional optical element, thus achieving low cost and miniaturization of a light-emitting unit. Moreover, the present disclosure can meet the actual placement requirement for the photoelectric conversion chip by adjusting the angle of θ, and further can control the proportion of the monitored power by changing the area of the reflective surface.

The present disclosure is described in detail above with specific embodiments. These detailed descriptions are merely used to help those skilled in the art understand the content of the present disclosure, and should not be construed as limiting the protection scope of the present disclosure. Various modifications and equivalent transformations made by those skilled in the art within the concept of the present disclosure shall fall within the protection scope of the present disclosure.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A collimating lens for receiving a divergent beam and converting it to a collimated beam, wherein the collimating lens comprises a lens main body and the lens main body includes:
   a light-incident surface into which the divergent beam is input;
   a first light exit surface from which the collimated beam is output;
   a second light exit surface;
   a reflective surface which reflects a certain proportion of a light beam to the second light exit surface for output;
   a cylindrical section; and
   a truncated cone section,
   wherein a free end of the cylindrical section forms the light-incident surface and a free end of the truncated cone section forms the first light exit surface; a protruding portion is formed along an optical axis direction at the free end of the truncated cone section, and the reflective surface is formed by plating the protruding portion with a reflective film; and a part of another end of the truncated cone section that protrudes from a side of the cylindrical section forms the second light exit surface.

2. The collimating lens according to claim 1, wherein an angle θ between the plane in which the second light exit surface is located and an optical axis of the first light exit surface is set in such a manner that the angle θ makes an incident angle of the light beam on the second light exit surface after being reflected by the reflective surface less than an angle of total reflection; and a height of the second light exit surface is set in such a manner that the light beam reflected by the reflective surface is completely incident on the second light exit surface.

3. A system for monitoring laser luminous power, comprising:
   a laser;
   the collimating lens of claim 2; and
   a photoelectric conversion chip;
   wherein the laser is connected to the light-incident surface of the collimating lens via an optical path, and the photoelectric conversion chip is connected to the second light exit surface of the collimating lens via an optical path.

4. A method for monitoring laser luminous power, comprising the following steps:
   emitting a light beam by a laser to a light-incident surface of a collimating lens;
   emerging a collimated beam from a first light exit surface of the collimating lens and transmitting the collimated beam to an optical fiber;
   emerging a feedback beam from a second light exit surface of the collimating lens to a photoelectric conversion chip; and
   generating luminous power of the laser according to an electrical signal converted by the photoelectric conversion chip;
   wherein the collimating lens is the collimating lens according to claim 2.

5. The collimating lens according to claim 1, wherein a projection of the reflective surface on the free end of the truncated cone section is in a sector shape, and an area $S_{13}$ of the sector shape is set in such a manner that:

$$S_{13}/(S_{12}+S_{13})=W_1/W_2$$

wherein $S_{13}$ is the area of the sector shape, $S_{12}$ is an area of the first light exit surface, $W_1$ is a required power of a feedback beam, and $W_2$ is a total power of the light beam input to the light-incident surface.

6. A system for monitoring laser luminous power, comprising:
   a laser;
   the collimating lens of claim 5; and
   a photoelectric conversion chip;
   wherein the laser is connected to the light-incident surface of the collimating lens via an optical path, and the photoelectric conversion chip is connected to the second light exit surface of the collimating lens via an optical path.

7. A method for monitoring laser luminous power, comprising the following steps:
   emitting a light beam by a laser to a light-incident surface of a collimating lens;
   emerging a collimated beam from a first light exit surface of the collimating lens and transmitting the collimated beam to an optical fiber;
   emerging a feedback beam from a second light exit surface of the collimating lens to a photoelectric conversion chip; and
   generating luminous power of the laser according to an electrical signal converted by the photoelectric conversion chip;
   wherein the collimating lens is the collimating lens according to claim 5.

8. The collimating lens according to claim 1, wherein the light-incident surface is a convex spherical surface and the first light exit surface is a plane.

9. A system for monitoring laser luminous power, comprising:
   a laser;
   the collimating lens of claim 8; and
   a photoelectric conversion chip;

wherein the laser is connected to the light-incident surface of the collimating lens via an optical path, and the photoelectric conversion chip is connected to the second light exit surface of the collimating lens via an optical path.

10. A method for monitoring laser luminous power, comprising the following steps:
emitting a light beam by a laser to a light-incident surface of a collimating lens;
emerging a collimated beam from a first light exit surface of the collimating lens and transmitting the collimated beam to an optical fiber;
emerging a feedback beam from a second light exit surface of the collimating lens to a photoelectric conversion chip; and
generating luminous power of the laser according to an electrical signal converted by the photoelectric conversion chip;
wherein the collimating lens is the collimating lens according to claim 8.

11. The collimating lens according to claim 1, wherein the light-incident surface is a plane and the first light exit surface is a convex spherical surface.

12. A system for monitoring laser luminous power, comprising:
a laser;
the collimating lens of claim 11; and
a photoelectric conversion chip;
wherein the laser is connected to the light-incident surface of the collimating lens via an optical path, and the photoelectric conversion chip is connected to the second light exit surface of the collimating lens via an optical path.

13. A method for monitoring laser luminous power, comprising the following steps:
emitting a light beam by a laser to a light-incident surface of a collimating lens;
emerging a collimated beam from a first light exit surface of the collimating lens and transmitting the collimated beam to an optical fiber;
emerging a feedback beam from a second light exit surface of the collimating lens to a photoelectric conversion chip; and
generating luminous power of the laser according to an electrical signal converted by the photoelectric conversion chip;
wherein the collimating lens is the collimating lens according to claim 11.

14. A system for monitoring laser luminous power, comprising:
a laser;
the collimating lens of claim 1; and
a photoelectric conversion chip;
wherein the laser is connected to the light-incident surface of the collimating lens via an optical path, and the photoelectric conversion chip is connected to the second light exit surface of the collimating lens via an optical path.

15. A method for monitoring laser luminous power, comprising the following steps:
emitting a light beam by a laser to a light-incident surface of a collimating lens;
emerging a collimated beam from a first light exit surface of the collimating lens and transmitting the collimated beam to an optical fiber;
emerging a feedback beam from a second light exit surface of the collimating lens to a photoelectric conversion chip; and
generating luminous power of the laser according to an electrical signal converted by the photoelectric conversion chip;
wherein the collimating lens is the collimating lens according to claim 1.

* * * * *